(12) United States Patent
Dhong et al.

(10) Patent No.: US 6,510,093 B1
(45) Date of Patent: Jan. 21, 2003

(54) METHOD AND APPARATUS FOR CYCLE TIME REDUCTION IN A MEMORY SYSTEM USING ALTERNATING REFERENCE CELLS AND ISOLATED SENSE LINES

(75) Inventors: Sang Hoo Dhong, Austin, TX (US); Hwa-Joon Oh, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/982,163

(22) Filed: Oct. 18, 2001

(51) Int. Cl.[7] .................................................. G11C 7/00
(52) U.S. Cl. ........................ 365/210; 365/190; 365/203
(58) Field of Search ................................ 369/210, 190, 369/203

(56) References Cited

U.S. PATENT DOCUMENTS

| | | | |
|---|---|---|---|
| 5,140,556 A | | 8/1992 | Cho et al. ..................... 365/210 |
| 5,339,274 A | * | 8/1994 | Dhong et al. ................ 365/203 |
| 5,461,589 A | | 10/1995 | Hidaka et al. ............... 365/210 |
| 5,757,710 A | * | 5/1998 | Li et al. ........................ 365/210 |
| 5,889,718 A | * | 3/1999 | Kitamoto et al. ............ 365/210 |
| 5,995,408 A | | 11/1999 | Kinney ........................ 365/210 |
| 6,043,562 A | | 3/2000 | Keeth .......................... 257/776 |
| 6,236,607 B1 | * | 5/2001 | Schlager et al. ............. 365/210 |
| 6,438,053 B1 | * | 8/2001 | Pöchmüller et al. ......... 365/210 |

FOREIGN PATENT DOCUMENTS

| | | | |
|---|---|---|---|
| JP | 3-276758 | 12/1991 | ......... G11C/11/401 |
| JP | 10-255461 | 9/1998 | ......... G11C/11/401 |

* cited by examiner

Primary Examiner—Tan T. Nguyen
(74) Attorney, Agent, or Firm—Anthony S. England; Casimer K. Salys

(57) ABSTRACT

In one aspect, reading a memory includes conductively coupling a memory cell and a first reference cell to respective lines of a selected bit line pair for a voltage development interval. During the interval a voltage differential develops on the bit line pair and is transmitted to a corresponding sense line pair. A second reference cell is precharged for the selected bit line pair for a reference cell precharging interval, the reference cell precharging interval being concurrent with at least a portion of the voltage development interval. A sense amplifier is enabled for a voltage detection interval. The bit line pair is precharged for a bit line precharging interval. The sense line pair is isolated from the bit line pair during the bit line precharging interval and the bit line precharging interval is concurrent with at least a portion of the voltage detection interval.

19 Claims, 4 Drawing Sheets

METHOD AND APPARATUS FOR CYCLE TIME REDUCTION IN A MEMORY SYSTEM USING ALTERNATING REFERENCE CELLS AND ISOLATED SENSE LINES

CROSS-REFERENCE TO RELATED APPLICATION

U.S. patent application Ser. No. 09/843,504, filed Apr. 26, 2001, "A Destructive Read Architecture For Dynamic Random Access Memories," which is assigned to the same assignee as the present application and is hereby incorporated herein by reference.

BACKGROUND

1. Field of the Invention

This invention relates to generally to integrated circuit memory devices, and more particularly to improving access cycle time for dynamic random access memories.

2. Related Art

For even inexpensive microprocessors, operating speed has increased dramatically in recent years. Just a few years ago inexpensive desktop computing systems commonly had microprocessors that operated at clock speeds below 500 million cycles per second. Today microprocessors in even relatively inexpensive desktop computing systems commonly operate at speeds of about 1 billion cycles per second. There is also a trend toward higher performance, and hence higher speed, for even less expensive, embedded processors in applications such as personal digital assistants, cell phones, electronic books, watches, etc. This is particularly brought on by the demand for rendering of images by such devices, such as for Internet browsers.

One of the consequences of this trend is a demand for higher speed memory systems. The speed of a dynamic random access memory "(DRAM")" is characterized by its random access cycle time, which is largely determined by the time to complete all the random access operations in a cycle, including word line activation, signal development on the bit lines, bit line sensing, signal write back, word line deactivation and bit line precharging. One approach to improving DRAM cycle time is described in the above cross referenced, related application, according to which memory cell contents is not written back each cycle, in order to reduce cycle time.

It is well known to use reference cells in DRAM. See, for example, Cho et al., U.S. Pat. No. 5,140,556, "Semiconductor Memory Circuit Having Dummy Cells Connected To Twisted Bit Lines;" Hidaka et al., U.S. Pat. No. 5,461,589, "Bit Line Structure For Semiconductor Memory Device With Bank Separation At Crossover Regions;" Kinney, U.S. Pat. No. 5,995,408, "Nonvolatile Thorough Electric Memory With Folded Bit Line Architecture;" and Keeth, U.S. Pat. No. 6,043,562, "Digit Line Architecture For Dynamic Memory" (all discussing performance related layout issues relating to memory cells and associated reference cell's, also known as "dummy cells"). See also Hideto et al., Japanese Patent 10,255,461, "Semiconductor memory" (discussing a decoder for selecting which dummy word line to associate with which word line); and Akira, Japanese Patent 3-276758 (discussing sharing of dummy word lines and ensuring adjacent bits are sensed in different cycles, so that a bit line may be shared between adjacent bit lines and consequently a word line length may be reduced). However, neither the related application, nor any of the other above references disclose changes in operation architecture or sequence to reduce memory system cycle time in connection with memory systems utilizing reference cells. Therefore, a need exists for further improvements.

SUMMARY OF THE INVENTION

The foregoing need is addressed in the present invention. In one aspect of the invention, a memory apparatus includes a number of memory cells addressable by word and bit lines. The true bit line in a bit line pair has ones of the memory cells coupled to respective ones of a first set of the word lines and has first and second reference cells coupled to respective first and second odd reference word lines. The complement bit line has ones of the memory cells coupled to respective ones of a second set of the word lines and has first and second reference cells coupled to respective first and second even reference word lines.

Stated generally, it is advantageous to include reference cells in pairs, as in the manner just described, because this enables using one of the reference cells during a read cycle, and precharging (that is, restoring) the other one during the same cycle. Then, in the next cycle, the reference cell that was just precharged can be used, while the reference cell that was just used can be restored. This saves time during each cycle because if there were only one reference cell for a bit line, the cell would have to be used and then restored during the same cycle.

More specifically, the memory apparatus is operable during a voltage development interval of a first read cycle, for a selected one of the word lines and bit line pairs, to conductively couple the corresponding memory cell to one of the bit lines and conductively couple the first one of the reference cells to the other one of the bit lines. The bit line pairs are coupled to respective sense lines of sense amplifiers by isolation circuitry, for selectively isolating the bit lines pair from the respective sense lines and sense amplifiers. During the voltage development interval a voltage differential develops on the selected bit line pair and is transmitted to the corresponding sense line pair. For a reference cell precharging interval that is concurrent with at least a portion of the voltage development interval, the apparatus precharges a second reference cell.

In another aspect, for a voltage detection interval the sense amplifier is enabled for the bit line pair and corresponding sense line pair. For a bit line precharging interval that is concurrent with at least a portion of the voltage detection interval, the corresponding sense line pair is isolated from the selected bit line pair and the selected bit line pair is precharged. The isolating of the sense lines from the bit lines is advantageous because it enables this overlapping of the voltage detection interval with the bit line precharging interval, which also reduces the time required for the read cycle.

The sense amplifier for the corresponding sense line pair is operable during the first read cycle voltage detection interval to detect the voltage differential developed on the sense lines. The detected voltage is transmitted to a static memory during the voltage detection interval. By saving the detected voltage to static memory the contents of the dynamic memory cell can be read in a "destructive" manner. This is advantageous because it enables the precharging (also referred to as "restoring") of the bit lines without regard for what voltage was asserted on them by the dynamic memory cell, making the bit line precharging faster.

The isolating of the sense lines from the bit lines is also advantageous because it permits precharging the sense lines during a sense line precharge interval (during which the sense amplifier is, of course, disabled) that is much shorter than the time interval required to precharge the bit lines, since the sense lines are relatively much shorter in length. That is, it permits the bit line precharging interval to begin earlier and then overlap in time with a portion of the sense line precharge interval.

Other advantages and objects of the invention will become apparent upon reading the following detailed description and upon reference to the accompanying drawings.

DETAILED DESCRIPTION

The claims at the end of this application set out novel features which applicants believe are characteristic of the invention. The invention, a preferred mode of use, further objectives and advantages, will best be understood by reference to the following detailed description of an illustrative embodiment read in conjunction with the accompanying drawings.

Figure 1:
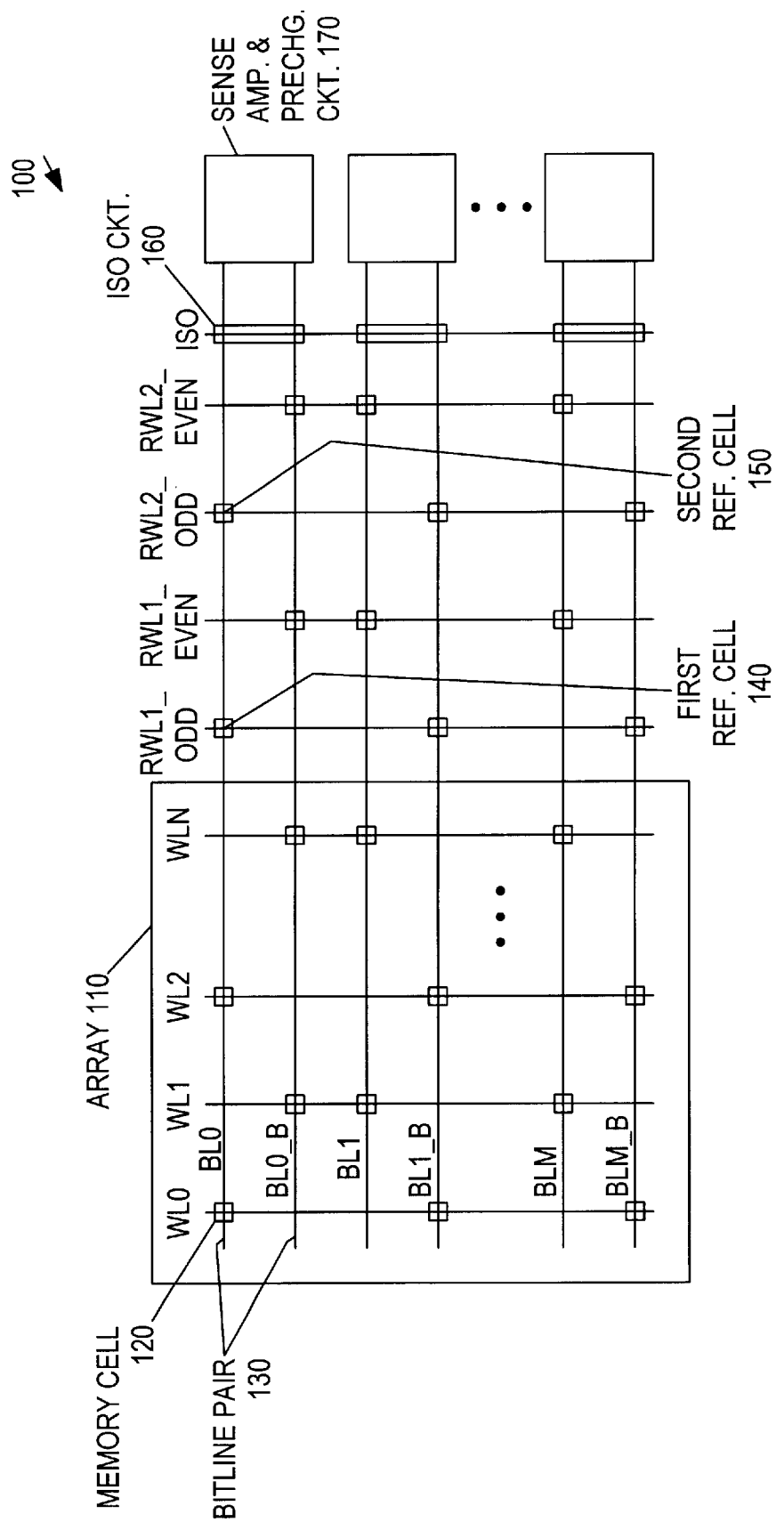
FIG. 1 illustrates a memory system 100, according to an embodiment of the invention.

Referring now to FIG. 1, a memory system 100 is shown. The system 100 has a DRAM memory core 110 with a number of DRAM memory cells 120, arranged in an array addressable by N word lines, WL0 through WLN, and M bit line pairs, BL0 through BLM and BL0_B through BLM_B. The "true" bit lines BL0, BL1, BL2, etc. have memory cells 120 connected to a first set of the word lines. Specifically, the even numbered ones of the true bit lines have memory cells 120 connected to the even numbered word lines, WL0, WL2, etc., and the odd numbered ones of the true bit lines have memory cells 120 connected to the odd numbered word lines, WL1, WL3, etc. The "complement" bit lines BL0_B, BL1_B, BL2_B, etc. have memory cells 120 connected to a second set of the word lines. Specifically, the even numbered ones of the complement bit lines have memory cells 120 connected to the odd numbered word lines WL1, WL3, etc., and the odd numbered ones of the complement bit lines have memory cells 120 connected to the even numbered word lines WL2, WL4, etc.

Each bit line also has two reference cells. The first reference cells 140 on the even true bit lines BL0, BL2, etc. are each coupled to reference word line RWL1_ODD. The second reference cells 150 on the even true bit lines are each coupled to reference word line RWL2_ODD. The first reference cells on the odd true bit lines BL1, BL3, etc. are each coupled to reference word line RWL1_EVEN. The second reference cells on the even true bit lines are each coupled to reference word line RWL2_ODD. The second reference cells on the odd true bit lines are each coupled to reference word line RWL2_EVEN. The first reference cells on the even complement bit lines BL0_B, BL2_B, etc. are each coupled to reference word line RWL1_EVEN. The first reference cells on the odd complement bit lines BL1_B, BL3_B, etc. are each coupled to reference word line RWL1_ODD. The second reference cells on the even complement bit lines are each coupled to reference word line RWL2_EVEN. The second reference cells on the odd complement bit lines are each coupled to reference word line RWL2_ODD.

Each bit line pair is coupled also to a sense amp and precharge circuit 170 through isolation circuitry 160.

Figure 2:
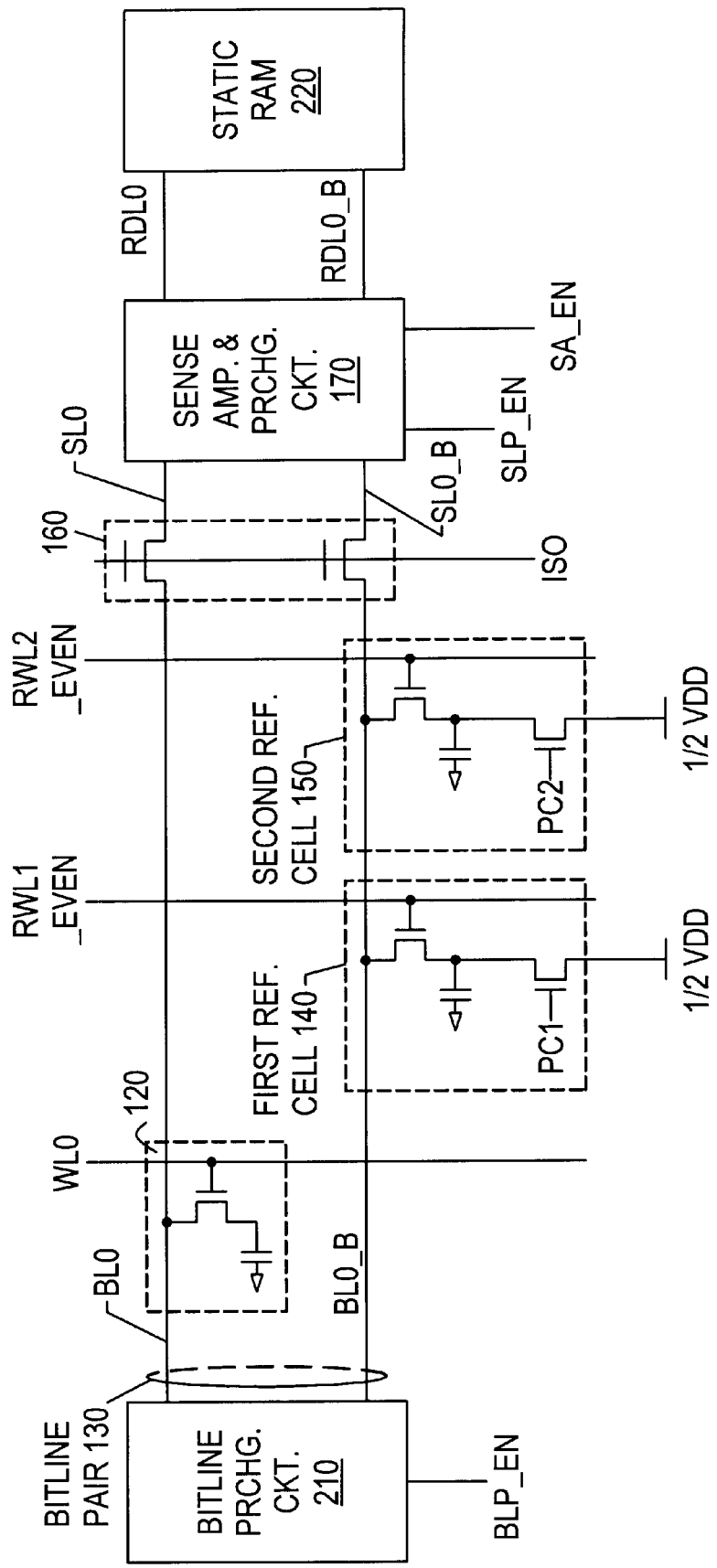
FIG. 2 illustrates further details for elements of the memory system 100 which are coupled to an exemplary one of the word lines, WL0, and bit line pairs, BL0/BL0_B, according to an embodiment of the invention.

Referring now to FIG. 2 details are shown for the above described elements which are coupled to an exemplary one of the bit line pairs, BL0/BL0_B, and word lines, WL0. At this level of detail it may be seen that each bit line pair, like the one shown in FIG. 2, is also coupled to its own respective bit line precharge circuit 210 which is turned on and off by a precharge control signal BLP_EN.

The structure of the exemplary memory cell 120, reference cells 140 and 150, and isolation circuitry 160 may also be seen at this level of detail. Each memory cell 120 has a capacitor with one of its electrodes coupled to ground and the other one of its electrodes coupled to the memory cell's bit line through the conducting electrodes of a word line transistor for the cell, and the gate of the transistor is coupled to the respective word line for the memory cell. Likewise, each reference cell has its own capacitor with one of its electrode coupled to one-half Vdd through the conducting electrodes of a precharge control transistor. The capacitor has its other electrode coupled to the reference cell's bit line through the conducting electrodes of a reference word line transistor for the reference cell. A gate of the reference word line transistor is coupled to the reference cell's reference word line. The first such reference cell precharge control transistor has its gate coupled to a first precharge signal, pc1. The second such reference cell precharge control transistor has its gate coupled to a second precharge signal, pc2.

The sense amplifier and precharge circuitry 170 is coupled on its input side to a sense line pair SL0 and SL0_B, and the sense line pair are coupled to the bit line pair via isolation circuitry 160. As may be seen at this level of detail, the isolation circuitry 160 includes a isolation transistor for each respective one of the bit lines, b1 and b1_b. the sense amplifier and precharge circuitry 170 is coupled on its output side to an SRAM array 220 by a pair of read lines RDL and RDL_B.

Figure 3:
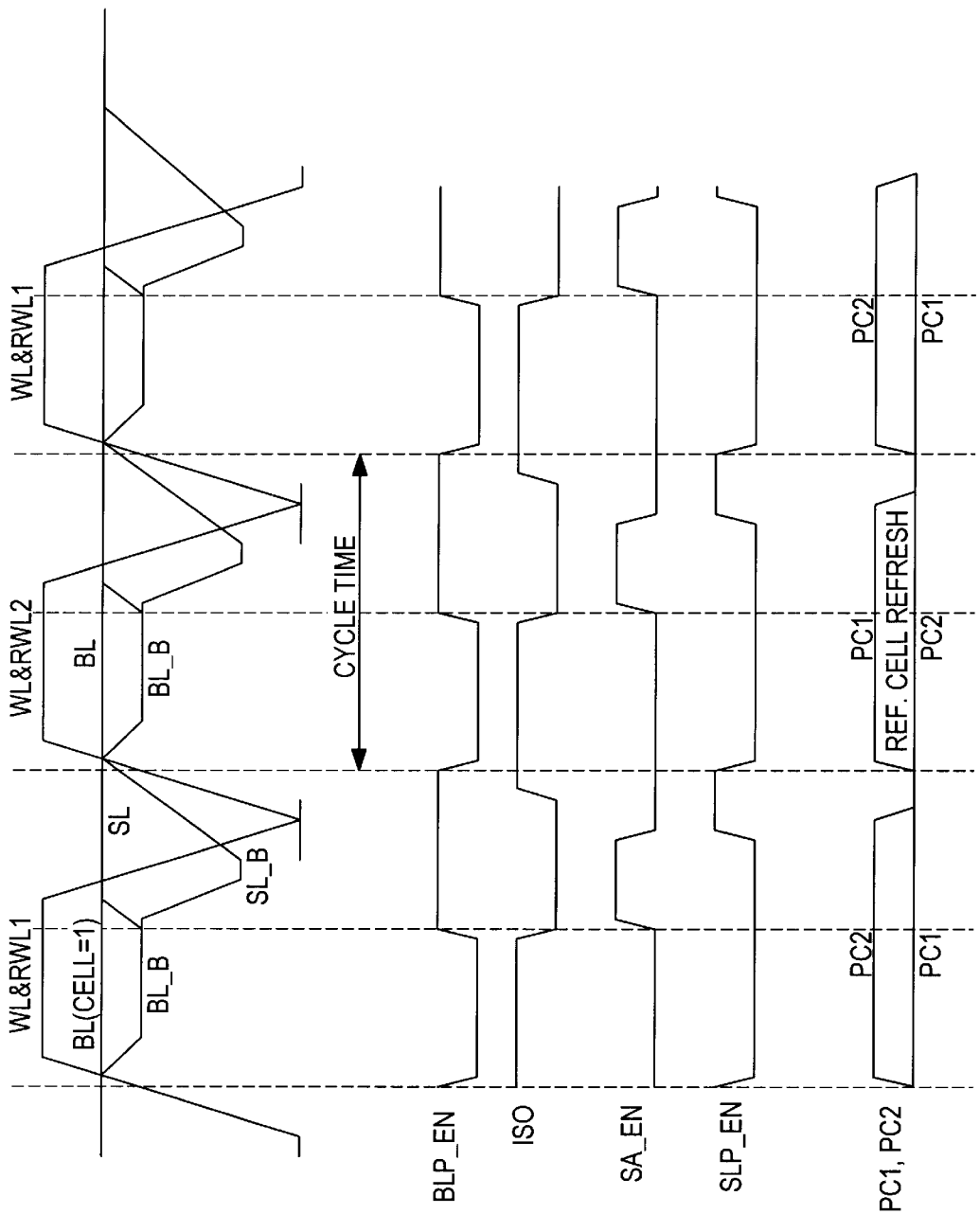
FIG. 3 illustrates aspects of timing of certain operations for the memory system 100, according to an embodiment of the invention.

Referring now to the timing diagram of FIG. 3, aspects of operation of the memory system 100 of FIGS. 1 and 2 are illustrated for three consecutive read cycles. In the example illustrated in the FIG., a different memory cell 120 is read in each one of the three read cycles. (In the example, each of the memory cells 120 happens to contain a "1." It should be understood that any of the memory cells could have contained either a "0" or a "1" during any of the cycles.)

The example in FIG. 3 illustrates an access in the first cycle to memory cell 120 (FIGS. 1 and 2) connected to word line WL0 and bit line BL0 (FIGS. 1 and 2). In this access the first reference cell 140 (FIGS. 1 and 2) is used for sensing the voltage in the memory cell via the bit line pair BL0/ BL0_B. (It should be understood that the issues illustrated here concern aspects of how an access is carried out within memory core 110. The memory cell has been externally selected to be read, as is understood by those of ordinary skill in the art, for reasons and by means not necessarily related to the issues of concern herein.) Before the cycle begins, all bit line and sense line pairs are precharged by the bit line precharge circuitry 210 and the sense amp and precharge circuitry 170, so that at the very beginning of the read cycle the BL0 voltage and BL0_B voltage are both high and the SL0 voltage and SL0_B voltage are both high.

At the beginning of a cycle, the word line signal for the memory cell that has been selected to be read is asserted on the word line for the memory cell. Also at the beginning of the cycle, one of the reference word line signals is asserted for one of the reference cells on the memory cell's bit line. Thus, the capacitors of the memory cell and reference cell are conductively coupled to the respective lines of the bit line pair. Since at this time the ISO signal is asserted, the bit line pair and the sense line pair are conductively coupled via the isolation circuitry 160. Consequently, the capacitors of the memory cell and reference cell are conductively coupled to the respective sense line via the bit line pair.

In the example, where the memory cell which is read in the first cycle is the memory cell coupled to word line WL0 and BL0, the memory cell's capacitor is conductively coupled to the BL0 line by assertion of the WL0 signal, and the reference cell's capacitor is conductively coupled to the BL0_B by assertion of the RLW1_EVEN signal. Since bit line RWL1_EVEN was precharged to only one-half Vdd, whereas the bit line BL0_B was precharged to Vdd, and since the reference memory cell is now conductively coupled to bit line BL0_B, this begins to pull down bit line BL0_B toward one-half Vdd, as shown.

Precharging also begins at the beginning of the first cycle, by the assertion of signal PC2, for all of the second reference cells 150 connected to RLW2_EVEN. By completion of precharging the cells 150 are precharged to one-half Vdd for use during the next cycle.

Next, at the beginning of a second stage of the cycle the sense lines are isolated from the bit lines by de asserting the ISO signal. With the bit lines decoupled from the sense lines the bit line precharge circuitry is enabled, by asserting the BLP_EN signal, in order to once again to precharge the bit lines so that they are ready for the next cycle. Also, the sense amplifier of the sense amplifier and precharge circuitry 170 is enabled to read the sense lines SL0 and SL0_B by asserting the SA_EN signal. As is seen in FIG. 3, once the bit lines and sense lines are decoupled and the sense amplifier is enabled, the sense amplifier amplifies the differential between the bit lines, pulling the sense line SL0_B down further. At this point the memory cell content detected by the sense amplifier is read out to the SRAM 220. Details of reading the memory cell out to the SRAM are disclosed in the related, cross-referenced application.

Next, in a third stage of the cycle, the SA_EN signal is de asserted, disabling the sense amplifier so that it no longer actively affects the sense lines. At this time the SLP_EN signal is asserted, causing the sense amplifier and precharge circuitry 170 to precharge the sense lines SL0 and SL0_B. Of course the sense line SL0 was never pulled down (since the memory cell happened to be charged to a digital logic value "1"), so precharging is of no consequence to SL0. However, the precharging has a dramatic effect on SL0_B. Note especially that the sense lines are precharged very quickly since they are isolated from the bit lines by isolation circuitry 160 and therefore are quite short.

Next the ISO signal is reasserted, conductively coupling the bit lines to the sense lines, and the SLP_EN signal is de asserted, turning off the precharging of the sense lines by precharge circuitry 170. Also at this point in the cycle, PC2 is de asserted to end precharging of all of the second reference cells 150 connected to RLW2_EVEN.

Thus, prior to the beginning of the second cycle all of the second reference cells have been precharged to one-half Vdd. Now precharging begins at the beginning of the second cycle, by the assertion of signal PC1, for all of the first reference cells 140 connected to RLW1_EVEN. By completion of the precharging the reference cells 140 are precharged to one-half Vdd for use during the next cycle.

In the example illustrated in FIG. 3, memory cell 120 (FIGS. 1 and 2) connected to word line WL2 and bit line BL0 (FIG. 1) is accessed in the second cycle, and the second reference cell 150 (FIGS. 1 and 2) is used for sensing the voltage on the bit line pair BL0/BL0_B in the second cycle. Once again, it should be understood that the memory cell has been externally selected to be read, as is understood by those of ordinary skill in the art, for reasons not necessarily related to the issues illustrated here concerning the mechanics of how the selection is carried out within memory core 110. The memory cell's capacitor is conductively coupled to bit line BL0 by assertion of the WL2 signal, and the capacitor of reference cell 150 is conductively coupled to BL0_B by assertion of the RLW2_EVEN signal. Since bit line RWL2_EVEN was precharged to only one-half Vdd, whereas the bit line BL0_B was precharged to Vdd, and since the reference memory cell is now conductively coupled to bit line BL0_B, this begins to pull down bit line BL0_B toward one-half Vdd, as shown.

Next, toward the middle of the second cycle, that is at the end of the first stage of the cycle, the sense lines are again isolated from the bit lines by deasserting the IOS signal. Very shortly thereafter, the bit line precharge circuitry is enabled by asserting the BLP_EN signal, in order to once again to precharged the bit lines so that they are ready for the next cycle. As is seen in FIG. 3, once the bit lines and sense lines are decoupled and the sense amplifier is enabled, the sense amplifier amplifies the differential between the bit lines, pulling the sense line SL0_B down further.

Next, at the beginning of the second stage of the cycle, the sense amplifier of the sense amplifier and precharge circuitry 170 is enabled to read the sense lines SL0 and SL0_B by asserting the SA_EN signal. Then, toward the end of the second stage of the cycle, the SA_EN signal is de asserted, disabling the sense amplifier from reading the sense lines, and then the SLP_EN signal is asserted, causing the sense amplifier and precharge circuitry 170 to precharge the sense lines SL0 and SL0_B.

Next the ISO signal is reasserted, coupling the bit lines to the sense lines, and the SLP_EN signal is de asserted turning off the precharging of the sense lines by precharge circuitry 170.

Also at this point in the cycle, PC1 is de asserted to end precharging of all of the first reference cells 140 connected to RLW1_EVEN.

Thus, prior to the beginning of the third cycle all of the first reference cells 140 have once again been precharged to one-half Vdd. Now precharging begins once again at the beginning of the third cycle for all of the second reference cells 150 connected to RLW2_EVEN, so that these cells 150 are available for use during the next cycle. The cyclical pattern of operation should be clear now from the description of the first two cycles, and therefore it is not necessary to further describe operation in the third cycle, although timing of the signals may be seen by inspection of FIG. 3.

Figure 4:
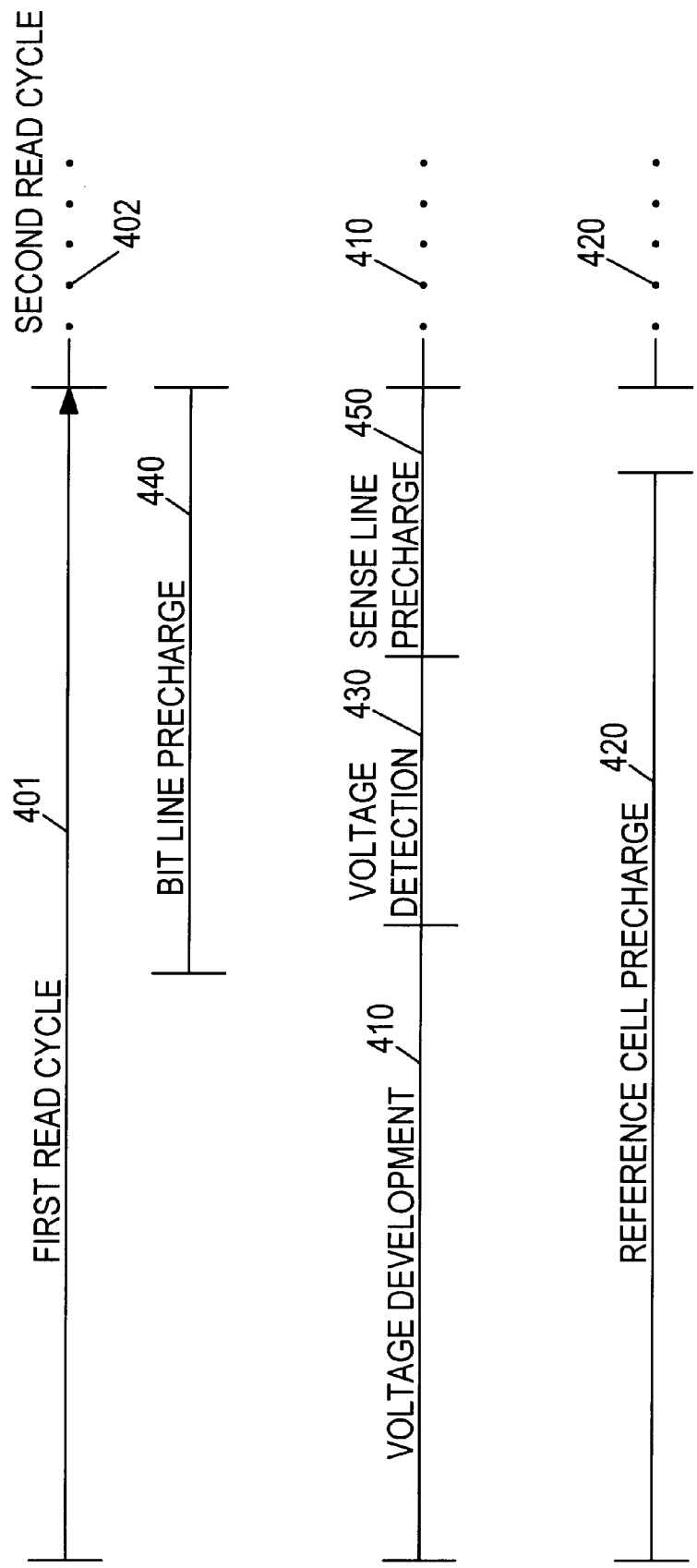
FIG. 4 illustrates certain timing aspects more generally, according to an embodiment of the invention.

Referring now to FIG. 4, certain timing aspects described above are illustrated more generally, according to an embodiment of the invention. During a voltage development interval 410 of a first read cycle 401 respective lines of the selected bit line pair BL0/BL0_B, for the selected word line WL0, are conductively coupled to the memory cell on bit line BL0, by assertion of the word line WL0, and the first one of the reference cells on the other one of the bit lines BL0_B by assertion of the reference word line RWL1_EVEN. During this interval the ISO signal (FIG. 3) is asserted, conductively coupling the sense amplifier 170 (FIG. 2) to the bit line pair and corresponding sense line pair, and the BLP_EN signal (FIG. 3) is deasserted, disabling the bit line precharging circuitry 210 (FIG. 2) and a voltage differential develops on the selected bit line pair BL0/BL0_B and is transmitted to the sense line pair SL0/SL0_B. Concurrent with the voltage development interval 410, during a reference cell precharging interval 420 a second reference cell for the bit line BL0_B precharges, responsive to assertion of precharge signal PC2 (FIG. 3) in this instance. (PC1 and PC2 alternate, so PC1 will be asserted in the next cycle 402.)

Next, for a bit line precharging interval 440 the sense line pair SL0/SL0_B is isolated from the selected bit line pair BL0/BL0_B by deassertion of ISO (FIG. 3), and the bit line pair is precharged by assertion of BLP_EN (FIG. 3). Also, a voltage detection interval 430 begins responsive to assertion of SA_EN (FIG. 3) which enables the sense amplifier 170 (FIG. 2). (During this time SLP_EN (FIG. 3) is deasserted.) The isolating of the sense lines from the bit lines is advantageous because it enables this overlapping of the voltage detection interval 430 with the bit line precharging interval 440, which reduces time required for the read cycle.

The sense amplifier for the sense line pair SL0/SL0_B is operable during the first read cycle 401 voltage detection interval to detect the voltage differential developed on the sense lines. The detected voltage is transmitted to static memory 220 during the voltage detection interval 430. By saving the detected voltage to static memory the contents of the dynamic memory cell can be read in a "destructive" manner during the cycle and then written back to the memory cell at some later time, if needed. This is advantageous because it enables the precharging of the bit lines for the next cycle without regard for what voltage was asserted by the dynamic memory cell, so that the bit line precharging is faster.

The isolating of the sense lines from the bit lines is also advantageous because it permits precharging the sense lines responsive to SLP_EN (FIG. 3) during sense line precharge interval 450 (during which the sense amplifier is, of course, disabled by deassertion of SA_EN) that is much shorter than the time interval required to precharge the bit lines, since the sense lines are relatively much shorter in length. That is, it permits the bit line precharging interval 440 to begin earlier and then overlap in time with a portion of the sense line precharge interval 450.

Shortly before the end of the cycle 401, the reference cell precharge interval 420 ends with deassertion of PC2. Then the cycle 401 ends with the ending of both the bit line precharge interval 440 (when the signal BLP_EN is deasserted and the signal ISO is asserted) and the sense line precharging interval 450 (when SLP_EN and SA_EN are deasserted). A new cycle 402 then begins with another voltage development interval 410 and another reference cell precharge interval 420.

The description of the present embodiment has been presented for purposes of illustration, but is not intended to be exhaustive or to limit the invention to the form disclosed. Many additional aspects, modifications and variations are also contemplated. For example, the particular arrangement of FIG. 1 may vary with respect to which word lines are connected to which memory cells for which bit lines.

What is claimed is:

1. A method for reading a memory, the method comprising the steps of:
   a) conductively coupling a memory cell and a first reference cell to respective lines of a selected bit line pair for a voltage development interval, wherein during the interval a voltage differential develops on the bit line pair and is transmitted to a corresponding sense line pair;
   b) precharging a second reference cell for the selected bit line pair for a reference cell precharging interval, wherein the reference cell precharging interval is concurrent with at least a portion of the voltage development interval;
   c) enabling a sense amplifier for a voltage detection interval; and
   d) precharging the bit line pair for a bit line precharging interval, wherein the sense line pair is isolated from the bit line pair during the bit line precharging interval and the bit line precharging interval is concurrent with at least a portion of the voltage detection interval.

2. The method of claim 1, wherein responsive to the enabling the sense amplifier detects the voltage differential developed on the sense lines, and wherein the method comprises the step of:
   transferring the detected voltage to a static memory during the voltage detection interval.

3. The method of claim 2, comprising the step of:
   precharging the sense lines during a sense line precharge interval, wherein for the sense line precharge interval the sense amplifier is disabled.

4. The method of claim 3, wherein the bit line precharging interval is concurrent with at least a portion of the sense line precharge interval.

5. The method of claim 4, wherein the steps a) through d) are for a first read cycle, the method comprising the steps of:
   conductively coupling the sense line pair to the bit line pair;
   conductively coupling the memory cell and the second reference cell to their respective lines of the bit line pair for the voltage development interval of a second read cycle; and
   precharging the first reference cell for the bit line pair for the reference cell precharging interval of the second read cycle, wherein for the second read cycle the reference cell precharging interval is concurrent with at least a portion of the voltage development interval.

6. The method of claim 5 comprising the steps of:
   enabling the sense amplifier for the voltage detection interval of the second read cycle; and
   precharging the bit line pair for the bit line precharging interval of the second read cycle, wherein for the second read cycle the bit line precharging interval is concurrent with at least a portion of the voltage detection interval.

7. The method of claim 1, comprising the step of:
   precharging the sense lines during a sense line precharge interval, wherein for the sense line precharge interval the sense amplifier is disabled.

8. The method of claim 7, wherein the bit line precharging interval is concurrent with at least a portion of the sense line precharge interval.

9. The method of claim 1, wherein the steps a) through d) are for a first read cycle, the method comprising the steps of:
   conductively recoupling the sense line pair to the bit line pair;

conductively coupling the memory cell and the second reference cell to their respective lines of the bit line pair for the voltage development interval of a second read cycle; and precharging the first reference cell for the bit line pair for the reference cell precharging interval of the second read cycle, wherein for the second read cycle the reference cell precharging interval is concurrent with at least a portion of the voltage development interval.

10. The method of claim 9 comprising the steps of:

enabling the sense amplifier for the voltage detection interval of the second read cycle; and precharging the bit line pair for the bit line precharging interval of the second read cycle, wherein for the second read cycle the bit line precharging interval is concurrent with at least a portion of the voltage detection interval.

11. A memory apparatus comprising a number of memory cells addressable by N word lines and M bit line pairs, such a bit line pair being coupled to a respective sense amplifier by isolation circuitry for selectively isolating the bit line pair from the sense amplifier, and having true and complement bit lines, wherein the true bit line has ones of the memory cells coupled to respective ones of a first set of the word lines and has first and second reference cells coupled to respectively different reference word lines, and the complement bit line has ones of the memory cells coupled to respective ones of a second set of the word lines and has third and fourth reference cells coupled to respectively different reference word lines.

12. The memory apparatus of claim 11, wherein the sense amplifier has inputs coupled to a sense line pair, the sense line pair being coupled to the sense amplifier's bit line pair via the bit line pair's isolation circuitry for selectively sensing a binary signal of one of the bit line pair's memory cells, and outputs coupled to a static memory array for storing the sensed binary signal.

13. The memory apparatus of claim 12, wherein the bit line pairs are coupled to respective bit line precharge circuits for selectively precharging the bit line pairs responsive to enabling by a precharge control signal.

14. The memory apparatus of claim 13 operable during a first read cycle to conductively couple to respective lines of a selected bit line pair, for a selected word line, the memory cell on one of the bit lines of the selected bit line pair and the first one of the reference cells on the other one of the bit lines of the selected bit line pair, develop a voltage differential on the selected bit line pair and transmit the voltage differential to a corresponding sense line pair during a voltage development interval, precharge a second reference cell for a reference cell precharging interval, wherein the reference cell precharging interval is concurrent with at least a portion of the voltage development interval, enable the sense amplifier for the corresponding sense line pair for a voltage detection interval, and precharge the selected bit line pair for a bit line precharging interval, wherein the corresponding sense line pair is isolated from the selected bit line pair during the bit line precharging interval and the bit line precharging interval is concurrent with at least a portion of the voltage detection interval.

15. The apparatus of claim 14, wherein the sense amplifier for the corresponding sense line pair is operable during the first read cycle to detect the voltage differential developed on the sense lines during the voltage detection interval, and wherein the apparatus is operable to transfer the detected voltage to the static memory during the voltage detection interval.

16. The apparatus of claim 15, operable during the first read cycle to precharge the corresponding sense lines during a sense line precharge interval, wherein for the sense line precharge interval the sense amplifier for the corresponding sense line pair is disabled.

17. The apparatus of claim 16, wherein the bit line precharging interval is concurrent with at least a portion of the sense line precharge interval.

18. The apparatus of claim 17, operable to conductively recouple the corresponding sense line pair to the bit line pair at the end of the first read cycle or the beginning of a second read cycle, conductively couple the memory cell and the second reference cell to their respective lines of the bit line pair for the voltage development interval of a second read cycle, and precharge the first reference cell for the bit line pair for the reference cell precharging interval of the second read cycle, wherein for the second read cycle the reference cell precharging interval is concurrent with at least a portion of the voltage development interval.

19. The apparatus of claim 17, operable to enable the sense amplifier for the voltage detection interval of the second read cycle, and precharge the bit line pair for the bit line precharging interval of the second read cycle, wherein for the second read cycle the bit line precharging interval is concurrent with at least a portion of the voltage detection interval.

* * * * *

UNITED STATES PATENT AND TRADEMARK OFFICE
CERTIFICATE OF CORRECTION

PATENT NO. : 6,510,093 B1
DATED : January 21, 2003
INVENTOR(S) : Dhong et al.

It is certified that error appears in the above-identified patent and that said Letters Patent is hereby corrected as shown below:

<u>Title page,</u>
Item [74], please delete "Anthony S. England" and insert -- Anthony V.S. England --, <u>Column 8,</u>
Line 28, please delete "2" and insert -- 1 --;
Line 35, please delete "4" and insert -- 1 --;
Line 37, please delete "coupling" and insert -- recoupling --;
Line 57, please delete "1" and insert -- 2 --.

Signed and Sealed this

Twelfth Day of August, 2003

JAMES E. ROGAN
*Director of the United States Patent and Trademark Office*